(12) United States Patent
Tallman et al.

(10) Patent No.: US 6,207,909 B1
(45) Date of Patent: Mar. 27, 2001

(54) LATCHING HANDLE MECHANISM FOR SECURING A MODULE

(75) Inventors: Ronald Tallman, Dingmans Ferry, PA (US); Robert H. Smolinski, Andover, NJ (US)

(73) Assignee: Transistor Devices, Inc., Cedar Knolls, NJ (US)

( * ) Notice: Subject to any disclaimer, the term of this patent is extended or adjusted under 35 U.S.C. 154(b) by 0 days.

(21) Appl. No.: 08/957,868

(22) Filed: Oct. 27, 1997

(51) Int. Cl.[7] ........................................ H01H 3/20
(52) U.S. Cl. ............................ 200/50.02; 200/43.16
(58) Field of Search ........................ 200/17 R, 43.01, 200/43.11, 43.14, 43.15, 43.16, 50.01, 50.02, 50.11, 50.12, 50.17, 50.19, 50.21, 50.23, 50.24, 50.26, 400, 401, 500, 501; 361/605–610, 615–619

(56) References Cited

U.S. PATENT DOCUMENTS

| 4,119,818 | * | 10/1978 | Noschese ........................ 200/50 AA |
| 4,789,919 | * | 12/1988 | Cox et al. ............................. 361/339 |
| 4,885,436 | * | 12/1989 | Pham et al. ......................... 200/50 A |
| 4,931,907 | * | 6/1990 | Robinson et al. .................... 361/391 |
| 5,450,280 | * | 9/1995 | Wactor ................................. 361/606 |
| 5,495,388 | * | 2/1996 | Bonetti et al. ....................... 361/609 |
| 5,739,488 | * | 4/1998 | Cassity et al. ..................... 200/17 R |

* cited by examiner

Primary Examiner—Michael Friedhofer
(74) Attorney, Agent, or Firm—Thomas L. Adams

(57) ABSTRACT

A latching handle mechanism can secure a module containing a circuit interrupter. The mechanism has a lever mounted at a handle frame to rotate between a secured position and a released position for securing and releasing the module at a structure. Also includes is a shuttle plate that is mounted at the handle frame and adapted to connect mechanically to the circuit interrupter. The shuttle plate is mounted to reciprocate between an engaged and disengaged position in order to operate the circuit interrupter. The shuttle plate is also manually reciprocatable to operate the circuit interrupter, when the lever is in the secured position. The lever is operable in the released position to restrain and prevent manual reciprocation of the shuttle plate in order to prevent manual operation of the circuit interrupter.

15 Claims, 3 Drawing Sheets

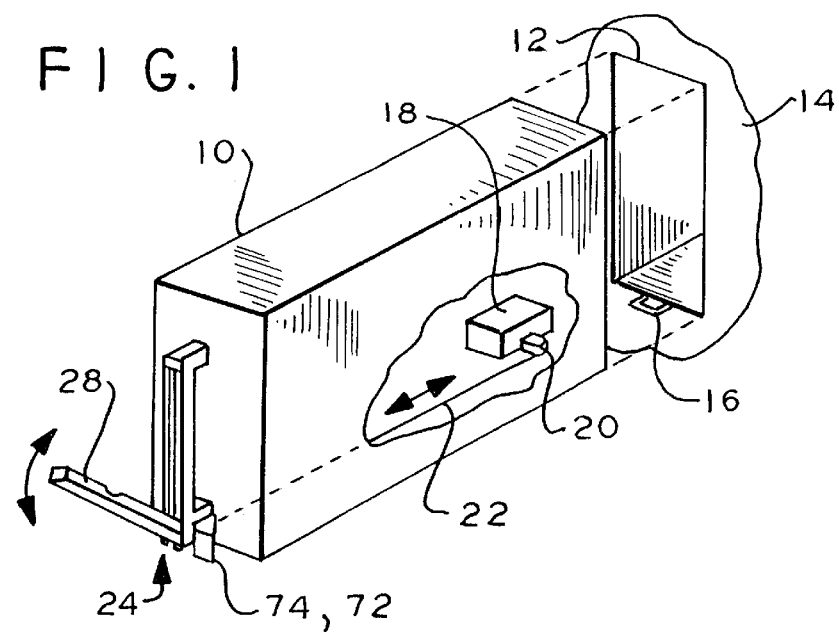
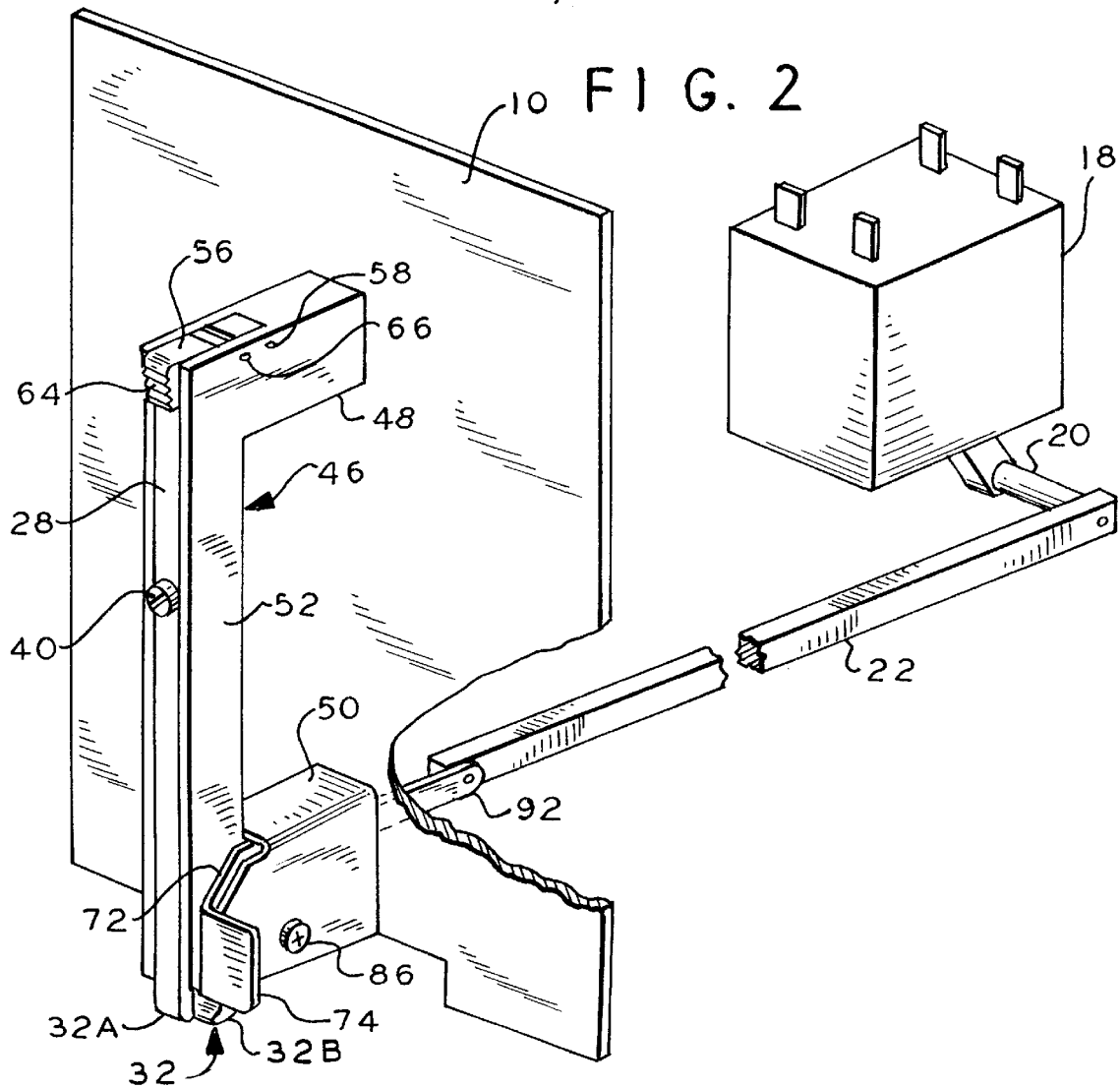

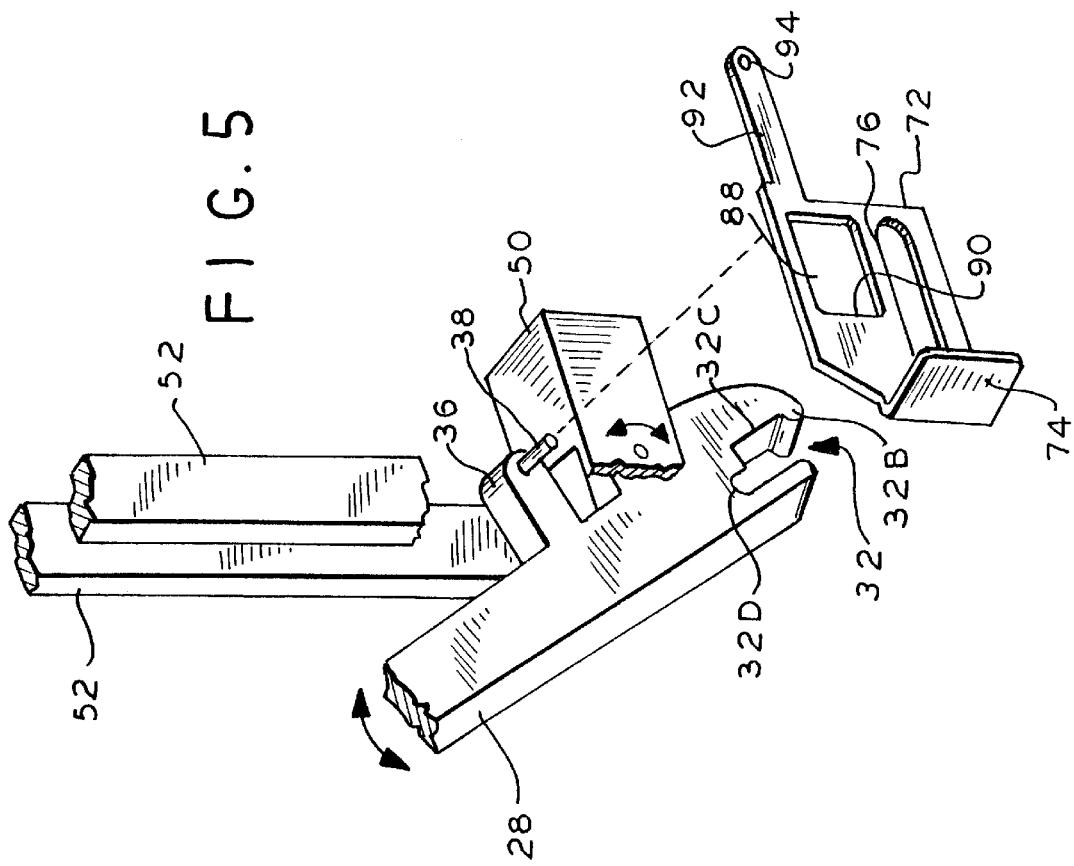
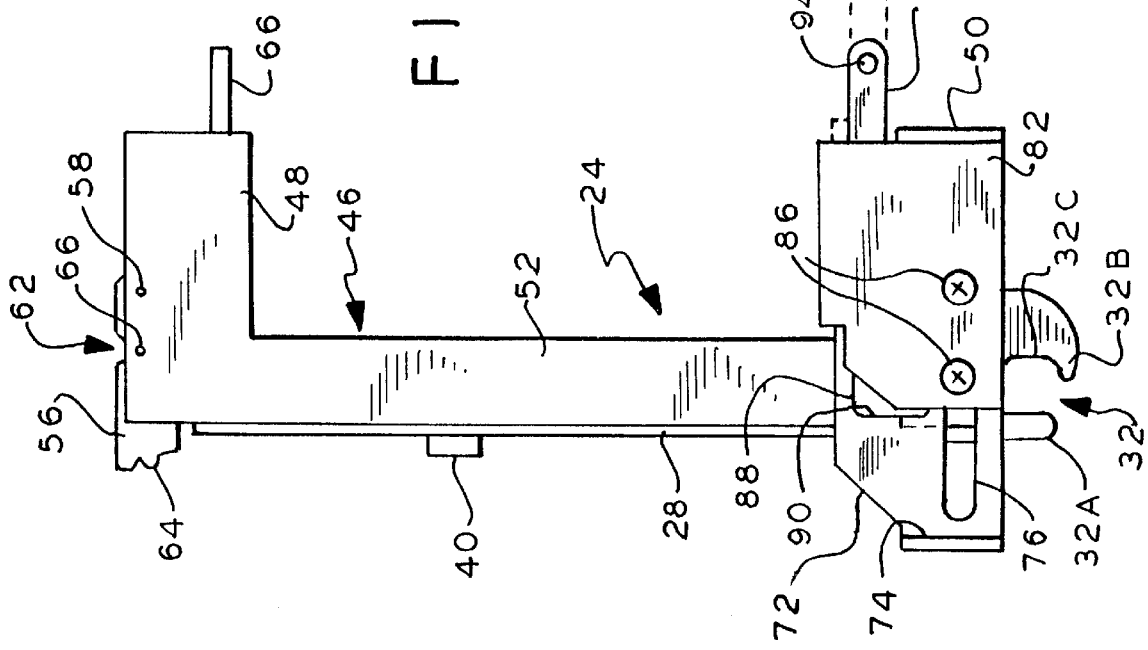

LATCHING HANDLE MECHANISM FOR SECURING A MODULE

BACKGROUND OF THE INVENTION

1. Field of the Invention

The present invention relates to handle mechanisms for securing a module, and in particular, to a mechanism having a lever means.

2. Description of Related Art

Electrical and electronic modules are often mounted in racks or other structure. These modules are arranged to be easily removed and replaced for maintenance and troubleshooting purposes. It is desirable to have a handle on the face of the module to make grasping and moving the module easier.

It is desirable to keep the module inactive during installation and removal, to avoid arcing that may otherwise occur should power be handled by connecting or disconnecting power with the module/rack connectors. These connectors are not normally designed to operate as main power breakers or interrupters. Instead, it is desirable to operate circuit breakers inside the module while the module is connected in place.

U.S. Pat. No. 4,931,907 shows a module with a handle assembly having a lever with a jaw at its lower end that is sized to engage a keeper on a rack. Thus, the module can be pushed into place and the lever swung to draw the module inwardly. As the module is drawn in, its rear connector will mate with a connector inside the rack. Also, the lever operates an enabling switch when the lever nears the up and locked position. The lever is finally swung into a secured position and held in place by a catch. This handle mechanism does not offer the capability of changing the state of the enabling switch after the handle is swung into the secured position.

U.S. Pat. No. 4,761,521 shows a drawout and interlock assembly employing a circuit breaker with an interlock button. As the circuit breaker is drawn out by a handle, the interlock button is released to trip the circuit breaker, but is then reactuated in an intermediate test position before being tripped again when the unit is completely removed. This handle mechanism lacks a manually operable member that can change the state of the circuit breaker, but only when the handle mechanism is in the operative position. See also U.S. Pat. Nos. 3,188,414 and 4,202,027.

Also, U.S. Pat. No. 4,119,818 shows an internal switch actuated when a module is pushed into position, but lacking the ability to reverse the state of the internal switch while the module is in place.

U.S. Pat. No. 3,749,862 shows a handle for rotating a tray and switch members on the tray. This handle mechanism, however, does not have the ability to change the state of the switch members after the handle is placed in the operative position.

In U.S. Pat. No. 1,632,592, a truck panel can be removed by rocking an external handle to move the panel and open an oil switch. U.S. Pat. No. 5,164,883 shows an interlock that prevents removal of a hot contactor. These two references do not include in the handle mechanism a feature for changing the state of a circuit breaker or contractor after the handle is placed in the operative position, while disabling such a feature when in the inoperative position.

In U.S. Pat. No. 5,033,972, the circuit card can be held in place by a knob. This knob can be swung to release a microswitch, and then pushed to operate a slider that ejects the card. This knob is not mounted on the removable card, and is not arranged to push the card into place.

See also U.S. Pat. Nos. 5,045,960; 1,366,504; and 4,057,716.

Accordingly, there is a need for a handle mechanism that is able to change the state of a circuit interrupter after securing a module, but disabling that feature when the handle mechanism releases the module.

SUMMARY OF THE INVENTION

In accordance with the illustrative embodiments demonstrating features and advantages of the present invention, there is provided a latching handle mechanism for securing a module containing a circuit interrupter into a structure. The mechanism includes a handle frame, a lever means, and a shuttle means. The lever means is mounted at the handle frame to rotate between a secured position and a released position for securing and releasing the module at the structure. The shuttle means is mounted at the handle frame and is adapted to connect mechanically to the circuit interrupter. The shuttle means is mounted to reciprocate between an engaged and disengaged position in order to operate the circuit interrupter. Also, the shuttle means is manually reciprocatable to operate the circuit interrupter when the lever means is in the secured position. The lever means is operable in the released position to restrain and prevent manual reciprocation of the shuttle means in order to prevent manual operation of the circuit interrupter.

By employing apparatus of the foregoing type, an improved handle mechanism is achieved that can be used to safely secure or remove a module. In a preferred embodiment, a shuttle plate is slidably mounted alongside a C-shaped handle frame that is attached to the front of the module. A lever can be mounted in the handle frame to pivot in the vicinity of the shuttle plate. In this preferred embodiment, a pin on the lever can fit into a window cut in the shuttle plate to withdraw the shuttle plate when the lever is pulled out to release the module. The withdrawing of the shuttle plate will positively disable an internal circuit breaker to allow safe removal of the module.

When a module is inserted, the lever can be raised to its secured position to lock the module in place. Then the pin on the lever can move across the window in the shuttle plate but will not drive it to an engaged position to close a circuit breaker or other circuit interrupter. Instead, an operator can place the lever in the secured position and then manually operate the shuttle plate to activate the circuit breaker (and deactivate it later, if desired).

BRIEF DESCRIPTION OF THE DRAWINGS

The above brief description as well as other objects, features and advantages of the present invention will be more fully appreciated by reference to the following detailed description of presently preferred but nonetheless illustrative embodiments in accordance with the present invention when taken in conjunction with the accompanying drawings, wherein:

FIG. 1 shows a structure adapted to receive a module bearing a latching handle mechanism in accordance with the principles of the present invention;

FIG. 2 is a more detailed perspective view of the latching handle mechanism of FIG. 2 mounted on an isolated front plate and showing an extender bar connecting to a circuit interrupter within the module;

FIG. 4 is a side view of the latching handle mechanism of FIG. 2 showing the shuttle means slid to a disengaged position (the engaged position shown in phantom); and FIG. 5 is a detailed view of the lower portion of the latching handle mechanism of FIG. 2 with portions broken away, removed, and illustrated in an exploded fashion, for illustrative purposes.

DETAILED DESCRIPTION OF THE PREFERRED EMBODIMENTS

Figure 3:
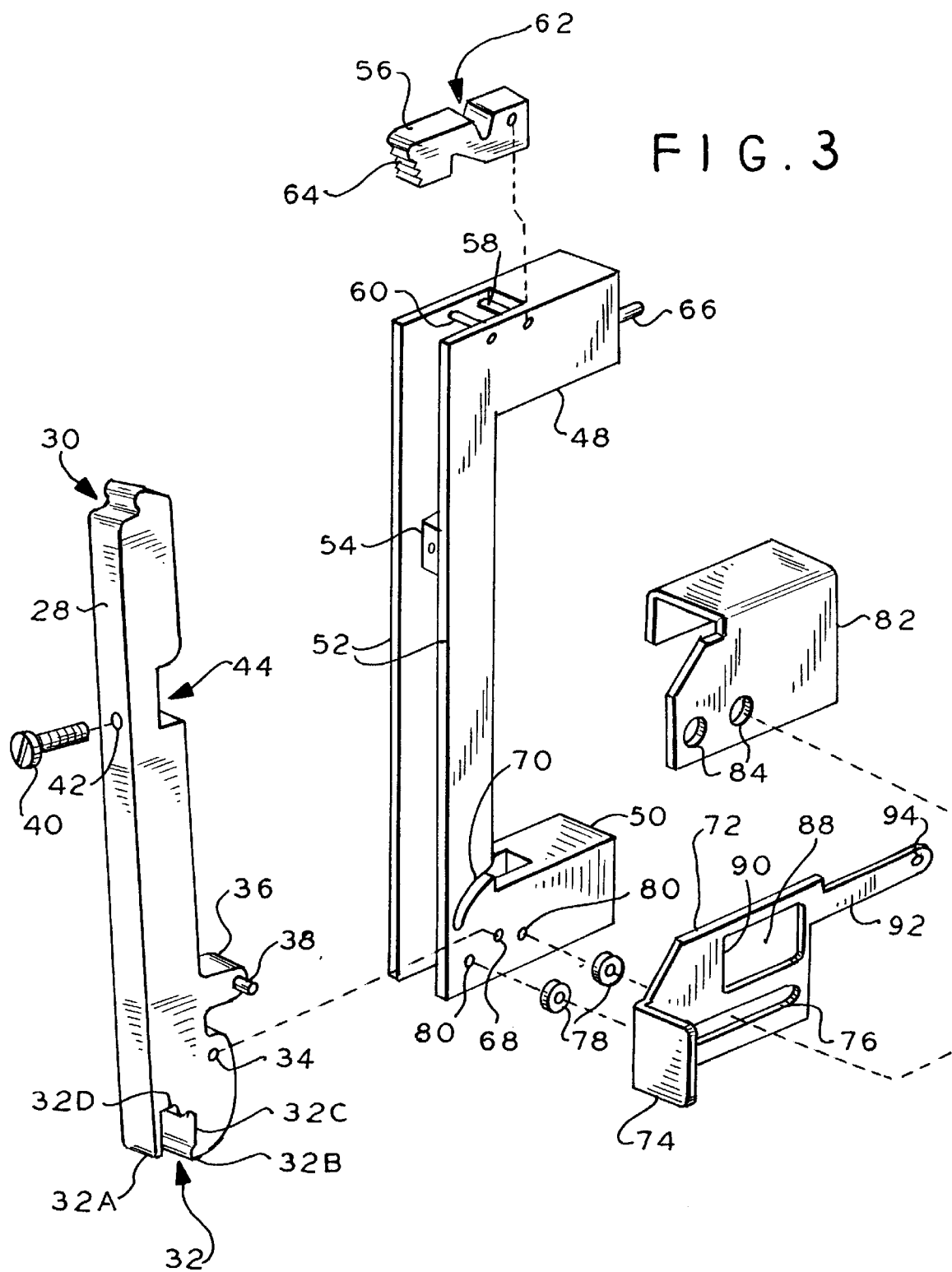
FIG. 3 is an exploded view of the handle mechanism of FIG. 2.

Referring to FIGS. 1 and 2, a module 10 is shown located next to an opening 12 in a rack 14, herein referred to as a structure. The structure 14 has a keeper bar 16 used to hold the module 10 in place in the manner to be described presently.

Module 10 can contain various types of electrical or electronic equipment. For example, module 10 may contain a power supply that converts alternating current from a primary power source into a regulated D.C. (direct current) voltage, although other types of electrical and electronic systems are contemplated.

Module 10 is shown housing a circuit interrupter, shown herein as circuit breaker 18; although a contactor, light duty electronic switch, or other device may be employed instead. The actuating arm 20 of circuit breaker 18 is shown attached to an extender bar 22 that connects to prong 92, which is part of a latching handle mechanism 24. Both ends of the extender bar 22 can be mounted by appropriate pins to the respective members 20 and 92. Mechanism 24 is shown with a pivotally mounted lever means 28, which is shown in the released position in FIG. 1 and in the secured position in FIG. 2.

Referring to FIGS. 2, 3, and 4, lever means 28 is shown as an aluminum bar having a rectangular cross-section throughout most of its length. The upper end of lever 28 is shown with an outwardly facing recess 30. The lower end of lever 28 is shown with a jaw 32 having a longitudinal tooth 32A and an opposing transverse tooth 32B. Tooth 32A extends from a concave lobe 32D, while tooth 32B extends from a concave lobe 32C.

Above bore 34 and extending inwardly is an arm 36, which supports on its right side a transverse pin 38 (sometimes referred to as a member). While the transverse pin on the lever means is shown in this fashion, in other embodiments, the pin may be a separate assembly that is attached in an alternate fashion without the need for an integral support arm.

A handle frame 46 is shown herein as a C-shaped aluminum structure having an upper stud 48 and a lower stud 50. Studs 48 and 50 are integral with a parallel pair of rails 52. A pin (not shown) can be mounted in pivot holes 68 in rails 52 to extend through bore 34 in lever 28, and thereby define a pivot axis for the lever. To allow pivoting, an arcuate slot 70 is cut in the right one of the rails 52 to give pin 38 clearance.

A spring loaded pin 66 is mounted to project from the inside end of stub 48. The opposite end of pin 66 projects into a recessed area of stub 48 near the rails 52. Pin 66 can extend when lever 28 moves into contact with the pin 66.

Affixed between rails 52 is a bridge 54 having a threaded hole designed to align with the threaded bore 42 on lever 28. A notch 44 on lever 28 is designed to straddle the bridge 54. A screw 40 is shown threaded through hole 42 to pass through notch 44 and thread into bridge 54. Screw 40 is herein referred to as a lock means.

Mounted in a recessed outer portion of stub 48 is a clasp 56. Clasp 56 is pivotally mounted on a pin 58. Pin 60 rides in a notch 62 atop clasp 56 to act as a leaf spring to depress the trigger end 62 of clasp 56. The end 64 of clasp 62 is hook shaped to engage the recess 30 on lever 28.

A shuttle means is shown herein as a main plate 72 integral with a transverse plate 74. Main shuttle plate 72 is essentially rectangular except for its beveled upper outside corner. A guiding slot 76 is shown parallel to the lower edge of the main plate 72 and riding on guides, namely, bushings 78. The bushings are held to the side of stub 50 at threaded holes 80 by means of a cover 82 that is secured through its screw holes 84 with screws 86. In alternate embodiments, pins projecting from the shuttle plate can ride in slots on the handle frame. In other embodiments, the shuttle plate need not slide linearly but may be pivotally mounted to act as another lever.

A rectangular window opening 88 above the guiding slot 76 has a bearing edge 90. As described further hereinafter, transverse pin 38 can bear against the bearing edge 90 of opening 88 to withdraw the shuttle means 72. In alternate embodiments, the bearing edge need not be part of a rectangular opening, and may simply be one of the outside edges of the shuttle plate. In other embodiments, the bearing edge may be oriented at an acute or an obtuse angle with respect to the direction of motion of the shuttle plate.

Extending from an upper inside corner of main plate 72 is an inner prong 92, whose tip has an aperture 94 for connecting to the previously mentioned extender bar (bar 22 of FIG. 2).

To facilitate an understanding of the principles associated with the foregoing apparatus, its operation will be briefly described. Module 10 (FIG. 1) can be positioned adjacent the opening 12 in structure 14, with the lever 28 rotated down to nearly a horizontal position. If the lever 28 is not lowered enough, the jaw opening 32 (FIG. 5) will not provide clearance to receive keeper 16.

With lever 28 lowered in this fashion, transverse pin 38 will swing back to bear against the bearing edge 90 of opening 88. Consequently, shuttle plate 72 will be withdrawn as shown in FIG. 4. The withdrawing of shuttle plate 72 causes extender bar 22 to retract and rotate the arm 20 (FIG. 2) to keep circuit breaker 18 open. Thus, an operator cannot press against transverse plate 74 to move the inner prong 92 to the engaged position. Thus the circuit breaker remains off.

As the module 10 is inserted into the opening 12 (FIG. 1), eventually the jaw opening 32 (FIG. 5) engages the keeper 16. Then the operator can lift the lever 28 from the released position upwardly towards the secured position. In so doing, the concave lobe 32C of the jaw 32 engages the keeper 16 to pull in the module 10.

Eventually, the lever 28 reaches the position shown in FIG. 4. In this secured position, the recess 30 (FIG. 3) gets hooked onto the outer end 64 of clasp 56. Also, lever 28 pushes pin 66 inwardly. Pin 66 can be aligned with a microswitch or other electrical switch (not shown) that can signal the electronics inside module 10 that the handle is in the secured condition and the unit is ready to operate. To keep the lever 28 in the secured position, the operator now can screw the screw 40 through the hole 42 in lever 28 into the threaded hole in bridge 54.

The foregoing operation did not force shuttle plate 72 to be driven inwardly to operate the circuit breaker 18. Next, the operator can press the transverse plate 74 in to move the extender bar 22 (FIG. 2), thereby rotating operating arm 20 and closing circuit breaker 18.

Assuming now that the transverse plate 74 has been depressed, circuit breaker 18 will be closed and the circuitry of module 10 will operate normally. If the operator wishes now to remove the module 10 (or remove power for any other reason), the operator may pull on transverse lever 74 to withdraw the shuttle plate 72, to turn the circuit breaker 18 off.

If the operator opts not to manually disable the circuit breaker, the module 10 can still be removed without manipulating plate 74. In that case, the operator can remove the screw 40 (FIG. 4) and lift the outer end 64 of clasp 56. This releases the upper end of lever 28, which can then be swung out. In so moving, the transverse pin 38 (FIG. 5) engages the bearing edge 90 of shuttle plate 72. Consequently, shuttle plate 72 is withdrawn and the prong 92 pulls the extender bar 22 (FIG. 2). As a result, the operating arm 20 is pivoted to turn the circuit breaker 18 off.

As the lever 28 is pulled down further, the inside surface of tooth 32A bears against the keeper 16 (FIG. 1) and this camming action extracts the module 10. Eventually, the keeper 16 will reach the concavity of lobe 32D. At this point, any rear connectors on the back of module 10 are disengaged and the unit can be removed.

It is appreciated that various modifications may be implemented with respect to the above described, preferred embodiment. In some embodiments, the circuit breaker can be located in different positions and may be linked to the shuttle means by chains, gears, or other mechanisms. In other embodiments, the connection between the lever and the shuttle plate may be through a camming or a gear action. While the main length of the handle frame is shown as a split body, in other embodiments, the frame may be solid or may have a shallow recess to receive the lever means. Also, the lever means need not be a straight bar, and in other embodiments it may be curved or have another shape. While the shuttle means is shown operating a circuit breaker, in other embodiments it may operate a light duty switch or a sensor that operates a relay or other equipment. The various illustrated components may be made out of metals, plastics, ceramics, etc. Also the various shapes, dimensions, and configurations of the illustrated components can be changed depending upon the desired size, strength, rigidity, etc.

Obviously, many modifications and variations of the present invention are possible in light of the above teachings. It is therefore to be understood that within the scope of the appended claims, the invention may be practiced otherwise than as specifically described.

What is claimed is:

1. A latching handle mechanism for securing a module containing a circuit interrupter to a structure, comprising:
   a handle frame;
   lever means mounted at said handle frame to rotate between a secured position and a released position for securing and releasing said module at said structure; and
   a shuttle means mounted at said handle frame and adapted to connect mechanically to said circuit interrupter, said shuttle means being mounted to reciprocate between an engaged and disengaged position in order to operate said circuit interrupter, said shuttle means being manually reciprocatable to operate said circuit interrupter when said lever means is in said secured position, said lever means being operable in said released position to restrain and prevent manual reciprocation of said shuttle means in order to prevent manual operation of said circuit interrupter, said lever means being operable when moved to said released position to drive said shuttle means to said disengaged position.

2. A latching handle mechanism according to claim 1 wherein said shuttle means includes a bearing edge, said lever means being operable to apply a force on said bearing edge to withdraw said shuttle means.

3. A latching handle mechanism according to claim 2 wherein said lever means is operable when moved to said released position to drive said shuttle means to said disengaged position.

4. A latching handle mechanism according to claim 1 wherein said shuttle means includes an opening, and wherein said lever means comprises:
   a member extending into said opening of said shuttle means for applying a force to move said shuttle means to the disengaged position.

5. A latching handle mechanism according to claim 4 wherein said shuttle means has a guiding slot, and wherein said handle frame includes:
   a guide projecting into the guiding slot on said shuttle means, said shuttle means being slidably mounted on said guide.

6. A latching handle mechanism according to claim 5 wherein said shuttle means has an inner prong, said latching handle mechanism comprising:
   an extension bar having a pair of ends, one connected to said inner prong and the other end adapted to be connected to said circuit interrupter.

7. A latching handle mechanism according to claim 1 wherein said shuttle means comprises:
   a main plate having a longitudinal axis and mounted to slide in a direction along said longitudinal axis; and
   a transverse plate affixed to said main plate and sized and positioned for manipulation.

8. A latching handle mechanism according to claim 1 wherein said shuttle means is mounted to reciprocate linearly.

9. A latching handle mechanism according to claim 1 wherein said shuttle means includes a bearing surface, and wherein said lever means comprises:

a transverse pin for engaging said bearing surface of said shuttle means and applying a force to move said shuttle means to the disengaged position.

10. A latching handle mechanism according to claim 9 wherein said lever means comprises:

a lever pivotally mounted on said handle frame;

an arm projecting from said lever, said transverse pin extending transversely from said arm.

11. A latching handle mechanism according to claim 10 wherein said handle frame has an arcuate slot providing clearance for said transverse pin.

12. A latching handle mechanism according to claim 10 wherein said handle frame comprises:

a pair of stubs adapted to attach to said module; and a pair of rails extending between said pair of stubs and spaced to receive said lever means.

13. A latching handle mechanism according to claim 9 wherein said lever means comprises:

a lever mounted on said handle frame to pivot about a pivot axis and having a jaw for engaging said structure, said jaw and said transverse pin being on opposite sides of said pivot axis.

14. A latching handle mechanism according to claim 1 wherein said handle frame comprises:

a clasp for holding said lever, said lever means comprising:

a lever pivotally mounted on said handle frame and having (a) a jaw for engaging said structure, and (b) a recess opposite said jaw for engaging said clasp; and a lock means mounted on said lever between said jaw and said recess for locking said lever onto said frame.

15. A latching handle mechanism according to claim 14 wherein said lever means is operable when moved to said released position to drive said shuttle means to said disengaged position.

\* \* \* \* \*